United States Patent
Ito et al.

(10) Patent No.: US 9,518,322 B2
(45) Date of Patent: Dec. 13, 2016

(54) FILM FORMATION APPARATUS AND FILM FORMATION METHOD

(71) Applicant: NUFLARE TECHNOLOGY, INC., Yokohama-shi, Kanagawa-ken (JP)

(72) Inventors: Hideki Ito, Yokohama (JP); Kunihiko Suzuki, Shizuoka-Ken (JP); Hidekazu Tsuchida, Yokosuka (JP); Isaho Kamata, Tokyo (JP); Masahiko Ito, Yokosuka (JP); Hiroaki Fujibayashi, Zushi (JP); Masami Naito, Inazawa (JP); Ayumu Adachi, Toyota (JP); Koichi Nishikawa, Nagoya (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/473,157

(22) Filed: Aug. 29, 2014

(65) Prior Publication Data

US 2015/0090693 A1    Apr. 2, 2015

(30) Foreign Application Priority Data

Oct. 2, 2013    (JP) .................. 2013-207534

(51) Int. Cl.
*C23C 16/46*    (2006.01)
*C23C 16/458*    (2006.01)
(Continued)

(52) U.S. Cl.
CPC ........... *C23C 16/466* (2013.01); *C23C 16/325* (2013.01); *C23C 16/4586* (2013.01);
(Continued)

(58) Field of Classification Search
CPC ............. C23C 16/466; C23C 16/45519; C23C 16/325; C23C 16/45565; C23C 16/4586; C30B 25/10; C30B 29/36; C30B 25/14
(Continued)

(56) References Cited

U.S. PATENT DOCUMENTS 4,539,933 A * 9/1985 Campbell ............. C23C 16/481
 118/719
5,453,124 A * 9/1995 Moslehi ............ C23C 16/45561
 118/715

(Continued)

FOREIGN PATENT DOCUMENTS

JP    05-152207    6/1993
JP    2011-171543    9/2011
(Continued)

OTHER PUBLICATIONS

Taiwanese Office Action issued Mar. 25, 2016, for counterpart Taiwanese Application No. 103132791; 8 pages.
(Continued)

*Primary Examiner* — Rudy Zervigon
(74) *Attorney, Agent, or Firm* — Finnegan, Henderson, Farabow, Garrett & Dunner LLP (57) ABSTRACT

A film formation apparatus according to an embodiment includes: a film formation chamber performing film formation on a substrate; a cylindrical liner provided inside of a sidewall of the film formation chamber; a process-gas supply unit provided at a top of the film formation chamber and having a first gas ejection hole supplying a process gas to inside of the liner; a first heater provided outside the liner in the film formation chamber and heating the substrate from above; a second heater heating the substrate from below; and a shielding gas supply unit having a plurality of second gas ejection holes supplying a shielding gas to a position closer
(Continued)

to a sidewall of the film formation chamber than a position of the first gas ejection hole.

12 Claims, 7 Drawing Sheets (51) Int. Cl.
*C23C 16/455* (2006.01)
*C23C 16/32* (2006.01)
*C30B 25/10* (2006.01)
*C30B 25/14* (2006.01)
*C30B 29/36* (2006.01)

(52) U.S. Cl.
CPC .. *C23C 16/45519* (2013.01); *C23C 16/45565* (2013.01); *C30B 25/10* (2013.01); *C30B 25/14* (2013.01); *C30B 29/36* (2013.01)

(58) Field of Classification Search
USPC .................. 118/715; 156/345.33–345.34
See application file for complete search history.

(56) References Cited

U.S. PATENT DOCUMENTS

| | | | | |
|---|---|---|---|---|
| 5,532,190 A * | 7/1996 | Goodyear | C23C 16/45512 | 118/715 |
| 5,884,009 A * | 3/1999 | Okase | H01L 21/67115 | 219/405 |
| 5,972,116 A * | 10/1999 | Takagi | C23C 16/4401 | 118/719 |
| 6,059,885 A * | 5/2000 | Ohashi | C23C 16/4401 | 118/715 |
| 6,113,705 A * | 9/2000 | Ohashi | C23C 16/4401 | 118/715 |
| 6,299,683 B1 * | 10/2001 | Rupp | C23C 16/325 | 117/88 |
| 6,403,927 B1 * | 6/2002 | Kato | H01L 21/67109 | 118/724 |
| 6,586,343 B1 * | 7/2003 | Ho | H01L 21/67017 | 118/719 |
| 6,821,910 B2 * | 11/2004 | Adomaitis | C23C 16/4412 | 118/715 |
| 7,052,546 B1 * | 5/2006 | Motakef | C23C 16/303 | 117/200 |
| 7,374,620 B2 * | 5/2008 | Ohmi | H01J 37/32192 | 118/715 |
| 8,030,599 B2 * | 10/2011 | Shimada | H01L 21/67109 | 118/724 |
| 8,075,692 B2 * | 12/2011 | Osborne | C23C 16/24 | 118/715 |
| 8,397,668 B2 * | 3/2013 | Kobayashi | H01J 37/32082 | 118/715 |
| 8,430,962 B2 * | 4/2013 | Masuda | C23C 16/45561 | 118/663 |
| 8,440,270 B2 * | 5/2013 | Morisaki | C23C 16/46 | 118/666 |
| 8,506,713 B2 * | 8/2013 | Takagi | C23C 16/409 | 118/715 |
| 8,539,908 B2 * | 9/2013 | Takagi | C23C 16/45521 | 118/695 |
| 8,632,634 B2 * | 1/2014 | Moriyama | C23C 16/4412 | 118/715 |
| 8,696,814 B2 * | 4/2014 | Morisaki | C23C 16/325 | 118/666 |
| 8,876,974 B2 * | 11/2014 | Han | C23C 16/45565 | 118/715 |
| 9,139,933 B2 * | 9/2015 | Tsumori | | |
| 2002/0023588 A1 * | 2/2002 | Yamamuka | C23C 16/4401 | 118/715 |
| 2003/0140853 A1 * | 7/2003 | Wada | C23C 16/46 | 118/715 |
| 2004/0253826 A1 * | 12/2004 | Ivanov | C23C 8/02 | 438/710 |
| 2005/0003600 A1 * | 1/2005 | Kasai | C23C 16/14 | 438/200 |
| 2005/0059246 A1 * | 3/2005 | Yamada | C23C 16/4401 | 438/689 |
| 2008/0092817 A1 * | 4/2008 | Kappeler | C30B 25/10 | 118/723 E |
| 2009/0014127 A1 * | 1/2009 | Shah | H01J 37/32366 | 156/345.29 |
| 2009/0142933 A1 * | 6/2009 | Yajima | H01L 21/68792 | 438/758 |
| 2009/0151639 A1 * | 6/2009 | Kasai | C23C 16/14 | 118/724 |
| 2009/0238971 A1 * | 9/2009 | Higashi | C23C 16/4584 | 427/255.5 |
| 2010/0015359 A1 * | 1/2010 | Morisaki | C23C 16/46 | 427/591 |
| 2010/0021631 A1 * | 1/2010 | Moriyama | C23C 16/4412 | 427/255.23 |
| 2010/0047448 A1 * | 2/2010 | Morisaki | C23C 16/4584 | 427/248.1 |
| 2010/0081285 A1 * | 4/2010 | Chen | G03F 7/40 | 438/710 |
| 2010/0092666 A1 * | 4/2010 | Morisaki | C23C 16/325 | 427/248.1 |
| 2010/0096084 A1 * | 4/2010 | Lee | H01L 21/67069 | 156/345.33 |
| 2010/0166955 A1 * | 7/2010 | Becker | C23C 16/4401 | 427/248.1 |
| 2010/0279008 A1 * | 11/2010 | Takagi | C23C 16/409 | 427/248.1 |
| 2011/0200749 A1 * | 8/2011 | Suzuki | C23C 16/4402 | 427/255.5 |
| 2011/0206866 A1 * | 8/2011 | Suzuki | C23C 16/4557 | 427/587 |
| 2011/0226418 A1 * | 9/2011 | Ishibashi | C23C 16/4405 | 156/345.27 |
| 2011/0306212 A1 * | 12/2011 | Sato | C23C 16/325 | 438/706 |
| 2012/0048180 A1 * | 3/2012 | Ito | C23C 16/325 | 117/88 |
| 2012/0244684 A1 * | 9/2012 | Suzuki | C23C 16/45517 | 438/478 |
| 2012/0325138 A1 * | 12/2012 | Suzuki | C30B 25/10 | 117/88 |
| 2013/0068159 A1 * | 3/2013 | Maeda | C23C 16/345 | 118/666 |
| 2013/0247816 A1 * | 9/2013 | Suzuki | H01L 21/02529 | 117/86 |
| 2014/0287539 A1 * | 9/2014 | Ito | C23C 16/4408 | 438/5 |
| 2014/0370691 A1 * | 12/2014 | Yamada | C30B 25/14 | 438/478 |
| 2015/0329967 A1 | 11/2015 | Ito et al. | | |

FOREIGN PATENT DOCUMENTS

| | | |
|---|---|---|
| JP | 2011-198840 | 10/2011 |
| JP | 2013-021113 A | 1/2013 |
| KR | 10-2012-0034547 A | 4/2012 |

OTHER PUBLICATIONS

Notification of Reasons for Rejection, issued by the Korean Intellectual Property Office, in corresponding counterpart Application No. 10-2014-0128969, mailed Feb. 1, 2016.

Notification of Reason for Rejection mailed Aug. 11, 2016, in counterpart Application No. 10-2014-0128969 issued by the Korean Intellectual Property Office; 10 pages.

* cited by examiner

FIG. 9

FILM FORMATION APPARATUS AND FILM FORMATION METHOD

CROSS REFERENCE TO RELATED APPLICATIONS

This application is based upon and claims the benefit of priority from the prior Japanese Patent Application No. 2013-207534, filed on Oct. 2, 2013, the entire contents of which are incorporated herein by reference.

FIELD

The embodiments of the present invention relate to a film formation apparatus and a film formation method.

BACKGROUND

Conventionally, in a manufacturing process of a semiconductor element that requires a crystal film having a relatively large film thickness, like a power device such as an IGBT (Insulated Gate Bipolar Transistor), an epitaxial growth technique of performing vapor phase growth of a single-crystal thin film on a substrate such as a wafer for film formation is employed.

In a film formation apparatus used for the epitaxial growth technique, for example, a wafer is placed in a film formation chamber that is kept at an ordinary pressure or a reduced pressure. While this wafer is heated, a gas serving as a source for film formation (hereinafter, also simply "source gas") is supplied to the film formation chamber. Subsequently, a thermal decomposition reaction and a hydrogen reduction reaction of the source gas occur on a surface of the wafer, thereby forming an epitaxial film on the wafer.

To manufacture an epitaxial wafer having a large film thickness with a high yield, it is necessary for a surface of a wafer to successively contact new source gases to increase the vapor-phase growth rate. Therefore, epitaxial growth is performed while a wafer is rotated at a high speed (see, for example, Patent Document 1).

In conventional film formation apparatus, a gas supply unit that supplies a source gas is provided at the top of a film formation chamber. A shower plate having a large number of source gas ejection holes formed thereon is connected to the gas supply unit. By using this shower plate, the source gas flow in the film formation chamber is uniformized and the source gas is uniformly supplied onto a wafer.

Because high-temperature heating at 1600° C. or more is required in SiC epitaxial growth and the like, a film formation apparatus including an auxiliary heater that heats a wafer from above has been used in addition to a heater that heats a wafer from below. This type of film formation apparatuss performing high-temperature heating have a problem that a supplied source gas contacts an inner wall surface of a film formation chamber, a film is deposited on the inner wall surface, and the film deposited on the inner wall surface is peeled off, so that particles are generated. There is another problem that, when an etching gas is supplied from a gas supply unit to clean a deposited material, an inner wall member of the film formation chamber is corroded, so that particles are generated. Furthermore, there is still another problem that it takes a long time to increase the temperature within the film formation chamber or to cool the film formation chamber.

An object of the present invention is to provide a film formation apparatus and a film formation method that can suppress generation of particles and can reduce a temperature-increasing time and a cooling time.

SUMMARY

A film formation apparatus according to an embodiment includes: a film formation chamber performing film formation on a substrate; a cylindrical liner provided inside of a sidewall of the film formation chamber; a process-gas supply unit provided at a top of the film formation chamber and having a first gas ejection hole supplying a process gas to inside of the liner; a first heater provided outside the liner in the film formation chamber and heating the substrate from above; a second heater heating the substrate from below; and a shielding gas supply unit having a plurality of second gas ejection holes supplying a shielding gas to a position closer to a sidewall of the film formation chamber than a position of the first gas ejection hole.

A film formation method according to an embodiment includes: carrying an SiC substrate into a film formation chamber; supplying a process gas including an SiC source gas to the film formation chamber via a shower plate provided at a top of the film formation chamber to perform film formation on the SiC substrate; and ejecting a shielding gas to a position closer to a sidewall of the film formation chamber than a position of the shower plate.

DETAILED DESCRIPTION

Embodiments will now be explained with reference to the accompanying drawings. The present invention is not limited to the embodiments.

(First Embodiment)

Figure 1:
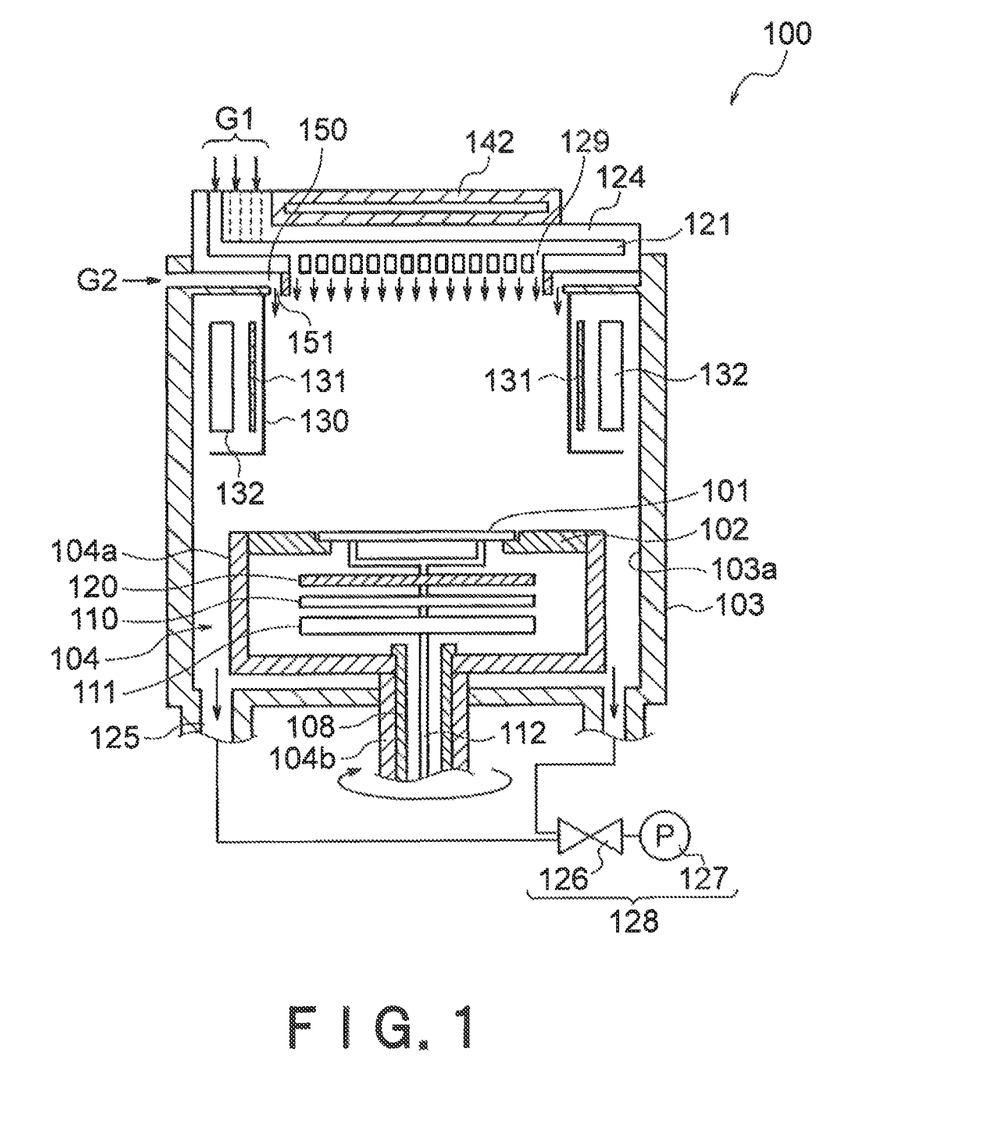
FIG. 1 is a schematic configuration diagram of a film formation apparatus according to a first embodiment.

FIG. 1 is a schematic configuration diagram of a film formation apparatus according to a first embodiment.

A substrate 101 formed of SiC is used as a sample serving as a target of a film formation process. FIG. 1 shows a state where the substrate 101. is placed on a susceptor 102. A gas (a process gas) G1 consisting of a plurality of types of gases and serving as a source for forming an SiC epitaxial film is supplied onto the substrate 101 placed on the susceptor 102 to cause a vapor phase growth reaction on the substrate 101, thereby performing film formation.

The film formation apparatus 100 includes a chamber 103 as a film formation chamber in which vapor phase growth is performed on the substrate 101 for film formation of an SiC epitaxial film.

In the chamber 103, the susceptor 102 is provided at the top of a rotating part 104. The susceptor 102 has a ring shape configured to have an opening. A counterbore is provided on an inner peripheral side of the susceptor 102, and an outer peripheral part of the substrate 101 is received by the counterbore, so that the substrate 101 is supported by the susceptor 102. Because the susceptor 102 is exposed to a high temperature, for example, the susceptor 102 is constituted by coating a surface of isotropic graphite with SiC having high thermal resistance and high purity by CVD.

The configuration of the susceptor 102 is not limited to that shown in FIG. 1. For example, the susceptor can be constituted by providing a member that closes its opening.

The rotating part 104 includes a cylinder part 104a and a rotating shaft 104b. In the rotating part 104, the susceptor 102 is supported on the top of the cylinder part 104a. The rotating shaft 104b is rotated by a motor (not shown), thereby rotating the susceptor 102 via the cylinder part 104a. In this manner, when the substrate 101 is placed on the susceptor 102, the substrate 101 can be rotated.

In FIG. 1, the cylinder part 104a is constituted so that the top thereof is open, and the top thereof is open. A heater (a main heater) 120 is provided in the cylinder part 104a. A resistance heating heater can be used as the heater 120, and this resistance heating heater is formed of, for example, a carbon (C) material having an impurity doped therein. Electricity is supplied to the heater 120 via a wire (not shown) passing through a substantially cylindrical quartz shaft 108 provided in the rotating shaft 104b, and the substrate 101 is heated from its back surface.

A reflector 110 is provided below the heater 120 in the cylinder part 104a in order to efficiently perform heating by the heater 120. The reflector 110 is formed of a high thermal resistance material such as carbon, SiC, or carbon having SiC coated thereon. A heat insulating material 111 is provided below the reflector 110. Therefore, it is possible to prevent heat from the heater 120 from being transmitted to the shaft 108 and the like, and heater power at the time of heating can be suppressed.

An elevating pin 112 as a substrate elevating unit is arranged in the shaft 108. A bottom end of the elevating pin 112 is extended to an elevating device (not shown) provided at the bottom of the shaft 108. By operating the elevating device, the elevating pin 112 can be moved up and down. The elevating pin 112 is used when the substrate 101 is carried into and out of the chamber 103. The elevating pin 112 supports the substrate 101 from below, lifts the substrate 101, and separates the substrate 101 from the susceptor 102. The elevating pin 112 is then operated to arrange the substrate 101 at a predetermined upward position away from the susceptor 102 on the rotating part 104 so that the substrate 101 can be passed and received to and from a transporting robot (not shown).

Furthermore, in the chamber 103, a cylindrical liner 130 that partitions a sidewall (an inner wall) 103a of the chamber 103 from a film formation area where a film formation process is performed is provided. The liner 130 is formed of a high thermal resistance material such as carbon or carbon having SiC coated thereon.

An auxiliary heater 131 that heats the substrate 101 from above is provided between the liner 130 and the sidewall 103a. For example, the auxiliary heater 131 is a resistance heating heater. Further, a heat insulating material 132 is provided between the auxiliary heater 131 and the sidewall 103a to prevent heat from the auxiliary heater 131 from being transmitted to the chamber 103. With this configuration, heater power at the time of heating can be suppressed.

A shower plate 124 is provided at the top of the chamber 103 of a film formation apparatus 100. The shower plate 124 functions to supply a process gas G1 including an SiC source gas for forming an SiC epitaxial film to a surface of the substrate 101 in a showering manner. The shower plate 124 has a plate shape having a predetermined thickness. The shower plate 124 can be formed of a metal material such as a stainless steel or an aluminum alloy.

A plurality of gas flow paths 121 are provided in the shower plate 124.

Figure 2:
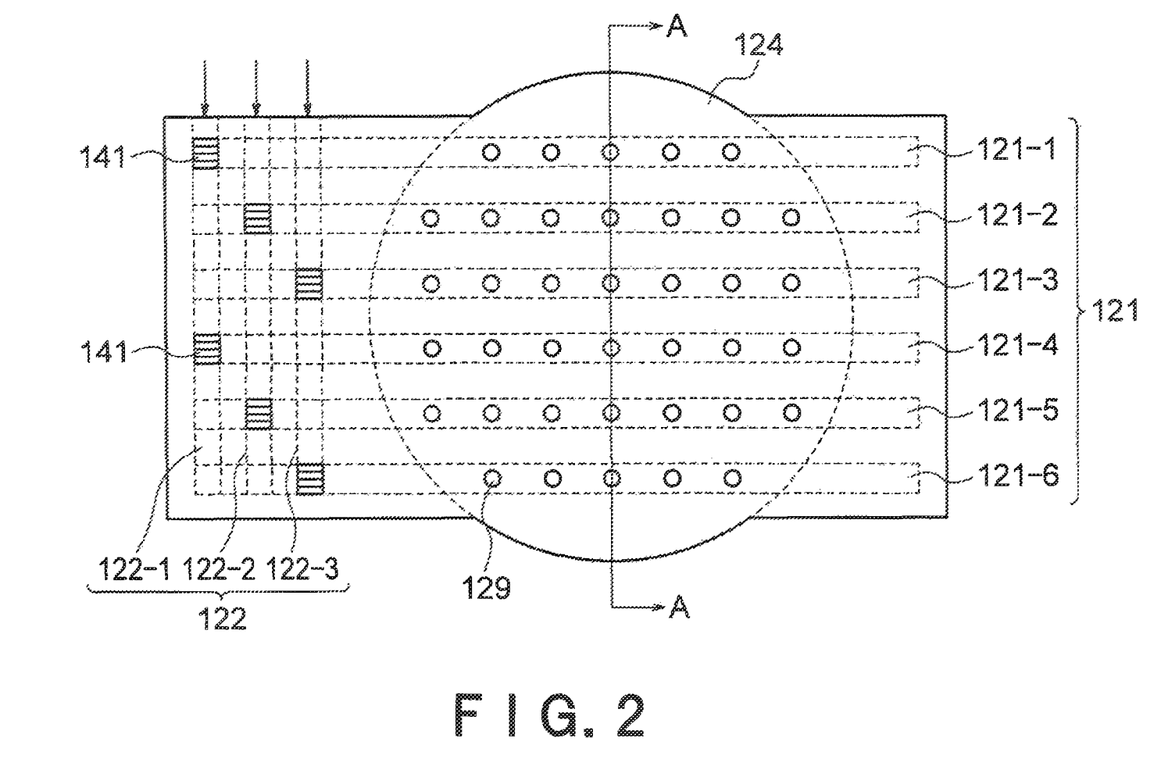
FIG. 2 is a schematic plan view of the shower plate 124 as viewed from a side of the substrate 101.
Figure 3:
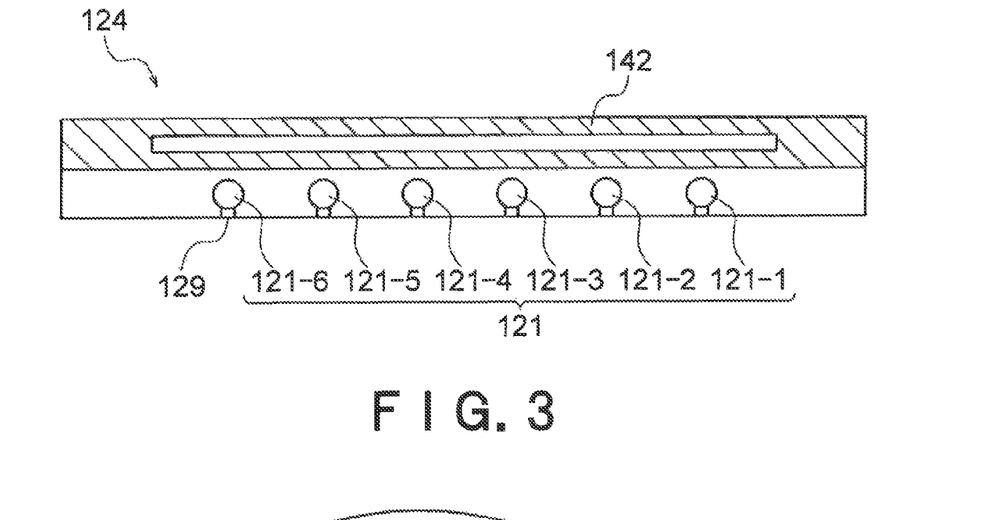
FIG. 3 is a schematic cross-sectional view along a line A-A in FIG. 2.

FIG. 2 is a schematic plan view of the shower plate 124 as viewed from a side of the substrate 101, FIG. 3 is a schematic cross-sectional view along a line A-A in FIG. 2.

In the film formation apparatus 100, the gas G1 consisting of a plurality of types of gases can be used to form an epitaxial film. For example, the gas G1 consists of three types of gases. The three types of gases are introduced in the chamber 103 by using the shower plate 124, are rectified in the chamber 103, respectively, and are supplied to the surface of the substrate 101. The shower plate 124 shown in FIG. 2 is configured to supply the three types of gases to the substrate 101 in the chamber 103 while separating the gases from each other without mixing them.

The number of types of gases used for forming an epitaxial film is not limited to three, and can be more than three or less than three. A case of using three types of gases is explained below.

Six gas flow paths 121-1 to 121-6 are provided in the shower plate 124 shown in FIG. 2 as the gas flow path 121. The substrate 101 in the chamber 103 is arranged horizontally on the susceptor 102. Therefore, the shower plate 124 is preferably installed so that a first surface of the shower plate 124 that faces to the side of the substrate 101 and opposes the substrate 101 is horizontal in the film formation apparatus 100. In this case, the gas flow paths 121-1 to 121-6 in the shower plate 124 are preferably provided along the first surface of the shower plate 124 and are formed to be extended horizontally in a state where the shower plate 124 is installed therein. Furthermore, the gas flow paths 121-1 to 121-6 are preferably arranged in the shower plate 124 with a predetermined distance therebetween.

According to the first embodiment, two gas flow paths 121 are used for one type of gas and then three types of gases are used, and thus six gas flow paths 121 are provided in total. However, the number of the gas flow paths 121 is not limited to six. An arbitrary number of the gas flow paths 121 can be used for each of a plurality of types of gases.

The shower plate 124 has a gas supply path 122 at an end thereof. The gas supply path 122 is arranged so as to intersect with the respective gas flow paths 121-1 to 121-6. For example, as shown in FIG. 2, the gas supply path 122 is arranged so as to form a matrix with the gas flow path 121. FIG. 2 shows an example of providing three gas supply paths 122-1 to 122-3 as the gas supply path 122 according to the number of types of gases to be used.

The three gas supply paths 122-1 to 122-3 respectively intersect with the six respective gas flow paths 121-1 to 121-6. The gas supply paths 122-1 to 122-3 constitute connection parts 141 at predetermined ones among the intersections with the gas flow paths 121-1 to 121-6, and are connected to the gas flow paths 121-1 to 121-6 by gas piping. For example, a connection part 141 is formed at an intersection of the gas supply path 122-1 with the gas flow path 121-1.

The gas supply path 122 is connected via a gas pipe (not shown) to a gas supply unit (not shown) constituted by a gas cylinder. For example, when an SiC epitaxial film is formed on the substrate 101, a source gas such as a carbon source gas or a silicon source gas is supplied from the gas supply unit.

Furthermore, the film formation apparatus 100 can perform an etching process as well as a film formation process. In the case of the etching process, an etching gas such as HCl is supplied from the gas supply unit as the process gas G1.

As shown in FIGS. 2 and 3, the shower plate 124 includes a plurality of gas ejection holes 129 punched so that the gas flow paths 1214 to 121-6 are communicated with a film formation area in the chamber 103 on a side of the first surface of the shower plate 124 facing to the substrate 101. The gas ejection holes 129 are punched at positions where the respective gas flow paths 121-1 to 121-6 are arranged and are arranged in a surface of the shower plate 124 in a distributed manner with a predetermined distance therebetween. The shower plate 124 can supply the gas G1 consisting of a plurality of types of gases to the substrate 101 in a showering manner while separating these gases from each other without mixing the gases with each other.

As shown in FIGS. 1 and 3, a hollow water cooling unit 142 in which a coolant such as cooling water passes is provided on a side of a second surface of the shower plate 124 that opposes the first surface facing to the side of the substrate 101 in which the gas ejection holes 129 are formed. Because the shower plate 142 includes the water cooling unit 142, the shower plate 124 can be cooled and it is possible to prevent the shower plate 124 from being in a high temperature state.

As shown in FIG. 1, an ejection part 150 including a gas ejection hole 151 that ejects a shielding gas G2 is provided at the top of the chamber 103, specifically above the liner 130 and below the shower plate 124. For example, the shielding gas G2 is a gas having low resistivity with the process gas G1 including an SiC source gas, such as a hydrogen gas, an argon gas, or a helium gas. The shielding gas G2 can be a single gas or be a mixed gas of these gases.

The gas ejection hole 151 is positioned closer to a side of the sidewall 103a of the chamber 103 than the gas ejection holes 129 of the shower plate 124. More specifically, a horizontal position of the gas ejection hole 151 (a position of the gas ejection hole 151 in the right-left direction in FIG. 1) is between the gas ejection holes 129 and the liner 130, and the shielding gas G2 is supplied vertically downward along the liner 130 to a film formation area.

A gas exhaust part 125 for exhausting gases supplied from the gas ejection holes 129 and 151 is provided at the bottom of the chamber 103. The gas exhaust part 125 is connected to an exhaust mechanism 128 constituted by an adjustment valve 126 and a vacuum pump 127. The exhaust mechanism 128 is controlled by a control mechanism (not shown) to adjust the inside of the chamber 103 to a predetermined pressure.

Figure 4:
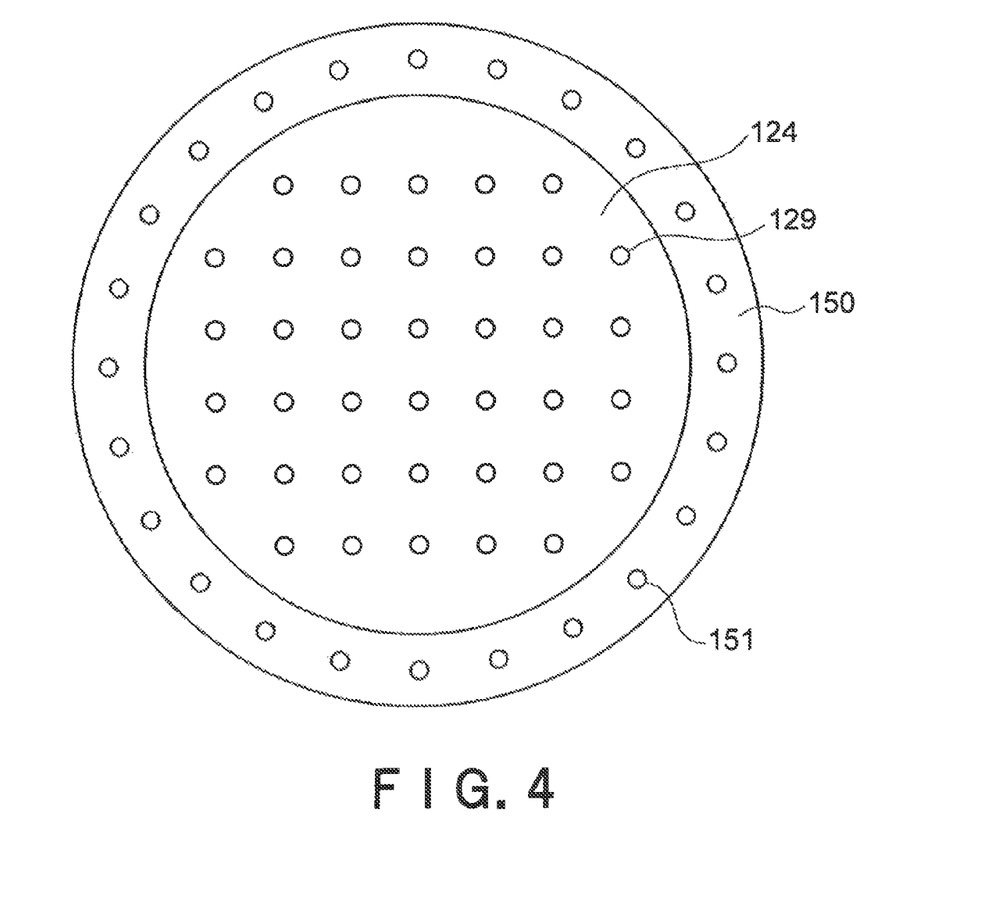
FIG. 4 is a schematic plan view of the shower plate 124 and the ejection part 150 as viewed from the side of the substrate 101.

FIG. 4 is a schematic plan view of the shower plate 124 and the ejection part 150 as viewed from the side of the substrate 101. As shown in FIG. 4, the ejection part 150 is provided at an outer peripheral part of the shower plate 124.

The shielding gas G2 that is supplied vertically downward from the gas ejection hole 151 of the ejection part 150 prevents the process gas G1 including an SiC source gas supplied from the gas ejection holes 129 of the shower plate 124 from contacting the liner 130. With this configuration, it is possible to prevent the process gas G1 including an SiC source gas for film formation from contacting the liner 130 and films from being deposited on the liner 130. Therefore, it is possible to prevent films deposited on the liner 130 from being peeled off and particles from being generated.

When the process gas G1 for etching is supplied from the gas ejection holes 129 of the shower plate 124, the shielding gas G2 protects the liner 130 from the etching gas and prevents the liner 130 from being corroded. By preventing corrosion, it is possible to prevent particles from being generated by member constituting the liner 130.

In the first embodiment, it is possible to configure that the temperature of the substrate 101 is measured as a radiation thermometer is provided at an upper part of the shower plate 124. In this case, a quartz glass window is provided in a part of the shower plate 124 and the temperature of the substrate 101 is measured through the quartz glass window by the radiation thermometer.

Furthermore, a quartz plate can be provided on a bottom surface of the shower plate. Because the shower plate 124 can be removed to perform chemical cleaning on the surface thereof, particles can be further reduced.

Further, while the shower plate 124 is provided in the first embodiment, even when the process gas G1 is supplied without via the shower plate 124, identical effects can be obtained.

The process gas G1 consisting of a plurality of types of gases can be supplied while these gases are mixed with each other or supplied while these gases are separated from each other.

(Second Embodiment)

Figure 5A:
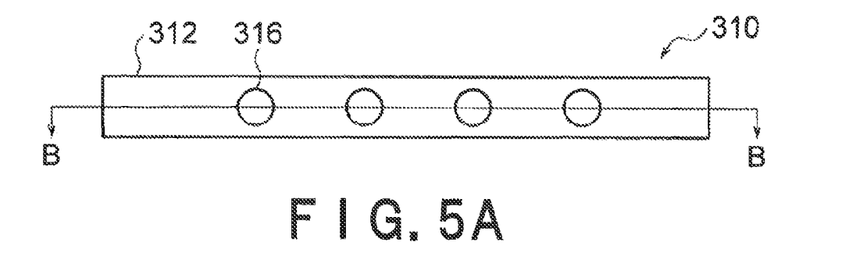
FIGS. 5A to 5C are explanatory diagrams of a configuration of the rod-like member 310 that is inserted into the gas flow path 121 of the shower plate 124.
Figure 5B:
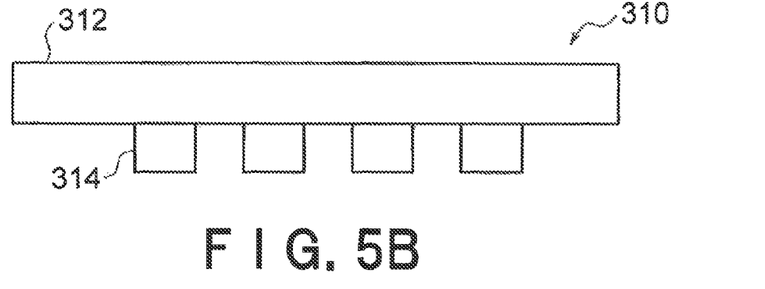
Figure 5C:
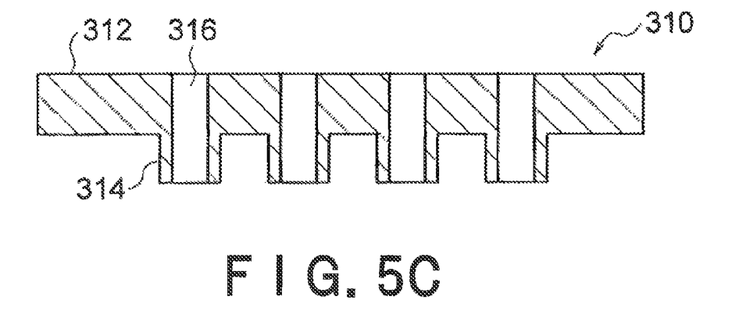

A second embodiment is different from the first embodiment shown in FIG. 2 in that an end of the gas flow path 121 is formed in a tunnel shape so as to horizontally penetrate the shower plate 124, and a rod-like member 310 shown in FIGS. 5A to 5C are inserted into the gas flow path 121.

The gas flow path 121 has a circular cross section and an end thereof that horizontally passes through the shower plate 124 is operable and closable. By opening the end of the gas flow path 121, the rod-like member 310 can be attached or detached to or from the gas flow path 121. By closing the end of the gas flow path 121, gas outflow can be prevented.

FIGS. 5A to 5C are explanatory diagrams of a configuration of the rodlike member 310 that is inserted into the gas flow path 121 of the shower plate 124, where FIG. 5A is a plan view of the rod-like member 310 and FIG. 5B is a side view of the rod-like member 310, and FIG. 5C is a cross-sectional view along a line B-B in FIG. 5A.

The rod-like member 310 includes a main body part 312 and protrusions 314 aligned with positions of the gas ejection holes 129 of the shower plate 124. The horizontal cross section of the protrusion 314 is substantially identical to that of the gas ejection hole 129, and the protrusion 314 is configured to be fitted into the gas ejection hole 129.

Through holes 316 that penetrate vertically the main body part 312 and the respective protrusions 314 are also provided in the rod-like member 310. The diameter of the through hole 316 is smaller than that of the gas ejection hole 129.

Figure 6:
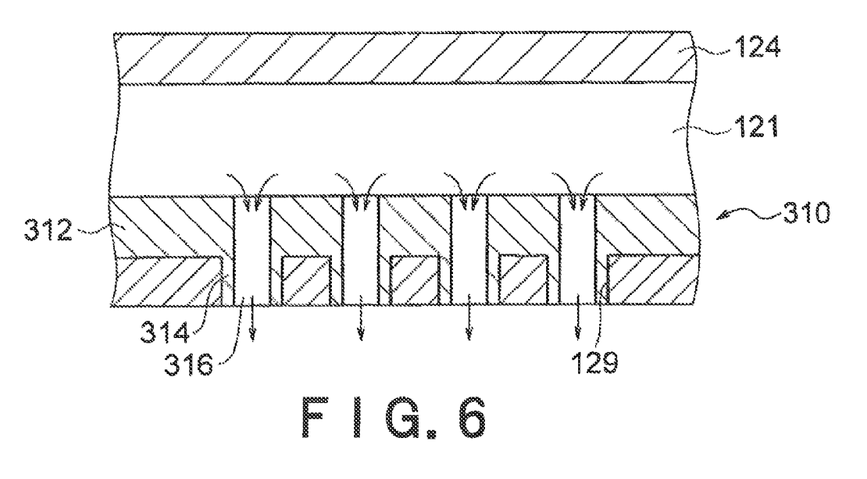
FIG. 6 is a schematic diagram of the gas flow path 121 having the rod-like member 310 inserted therein.

FIG. 6 is a schematic diagram of the gas flow path 121 having the rod-like member 310 inserted therein. When the rod-like member 310 is inserted into the gas flow path 121 and the protrusions 314 are respectively fitted into the gas ejection holes 129, a space is formed between the gas flow path 121 and the main body part 312 of the rod-like member 310 in the gas flow path 121, thereby securing a gas flow path.

When the protrusions 314 are respectively fitted into the gas ejection holes 129, the through holes 316 function as gas ejection holes that cause the gas flow path 121 to be communicated with the film formation area in the chamber 103.

In this manner, the rod-like member 310 inserted into the gas flow path 121 functions as a closing member that closes at least a part of the gas ejection holes 129 that cause the gas flow path 121 to be communicated with the chamber 103.

The rod-like member 310 can be also formed in a hollow cylindrical shape and the outer diameter thereof is set to match the outer diameter of the gas flow path 121, thereby omitting the protrusions 314, and positions of the through holes 316 are precisely aligned with positions of the gas ejection holes 129, so that the through holes 316 can function as gas ejection holes that cause the gas flow path 121 to be communicated with the film formation area in the chamber 103. Furthermore, the rod-like member 310 can function as a closing member that closes at least a part of the gas ejection holes 129 that cause the gas flow path 121 to be communicated with the chamber 103.

The degree of closing of the gas ejection hole 129 changes depending on the diameter of the through hole 316. As the diameter of the through hole 316 is increased, the degree of closing of the gas ejection hole 129 is reduced, and as the diameter of the through hole 316 is reduced, the degree of dosing of the gas ejection hole 129 is increased. By not providing the through hole 316, the gas ejection hole 129 can be closed.

Therefore, by changing the diameter of the through hole 316, the process gas G1 can be ejected from a gas ejection hole having a desired diameter that is different from the gas ejection hole 129 having already been punched in the shower plate 124 toward the substrate 101. With this configuration, the uniformity of gas flow rate can be improved.

Based on whether the through holes 316 is provided or not, the gas ejection holes 129 that are actually used can be selected among the gas ejection holes 129 having already been punched in the shower plate 124. That is, among the gas ejection holes 129 provided in the gas flow path 121, desired gas ejection holes 129 can be closed by the protrusions 314 of the rod-like member 310 in which the through holes 316 are not formed. With this configuration, the gas ejection holes 129 to be used can be selected and the process gas G1 can be ejected toward the substrate 101.

When the size of the substrate 101 is small, it is preferable that the through holes 316 of the rod-like member 310 are selectively provided only near the central part of the main body part 312 and are not provided at parts near ends of the main body part 312. In this preferable case, among the gas ejection holes 129 provided in the gas flow path 121, the gas ejection holes 129 at the ends of the main body part 312 are closed by the protrusions 314 of the rod-like member 310. The gas ejection holes 129 near the central part of the main body part 312 are selected as the gas ejection holes 129 that can eject the process gas G1. In this manner, optimum gas supply according to the size of the substrate 101 can be realized, and gas usage efficiency can be improved.

(Third Embodiment)

In the first embodiment, as shown in FIG. 2, the gas supply path 122 intersects with the gas flow path 121 and constitutes the connection parts 141 at predetermined ones among intersections, and the gas supply path 122 is connected via a gas pipe (not shown) to a gas supply unit. The process gas G1 supplied from the gas supply unit is then ejected from the gas ejection holes 129 via the gas pipe, the gas supply path 122, and the gas flow path 121.

Figure 7A:
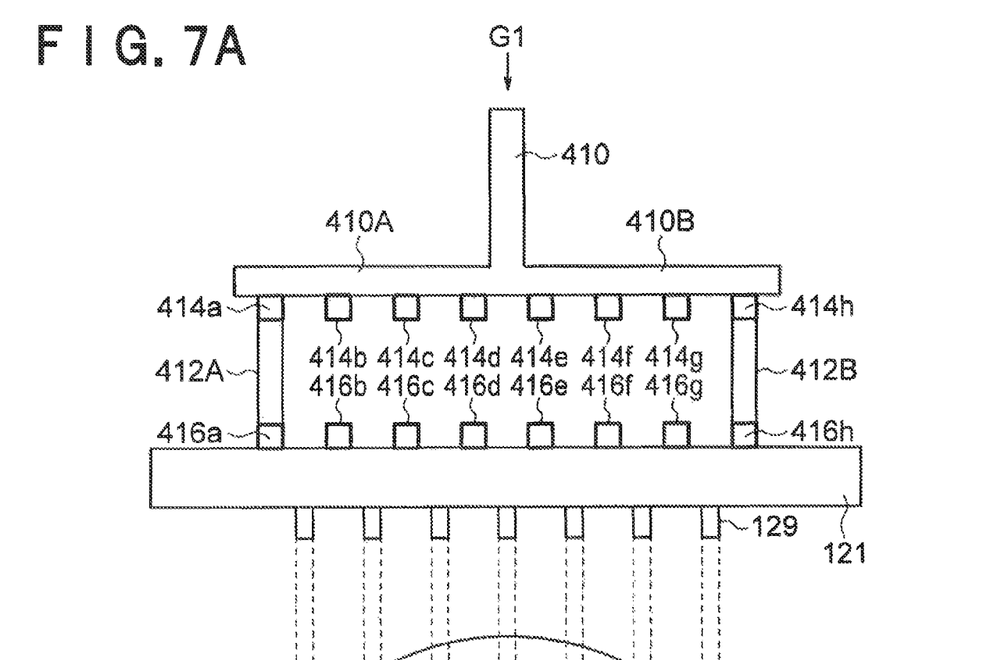
FIGS. 7A and 7B show a schematic configuration of a process gas supply unit according to a third embodiment.
Figure 7B:
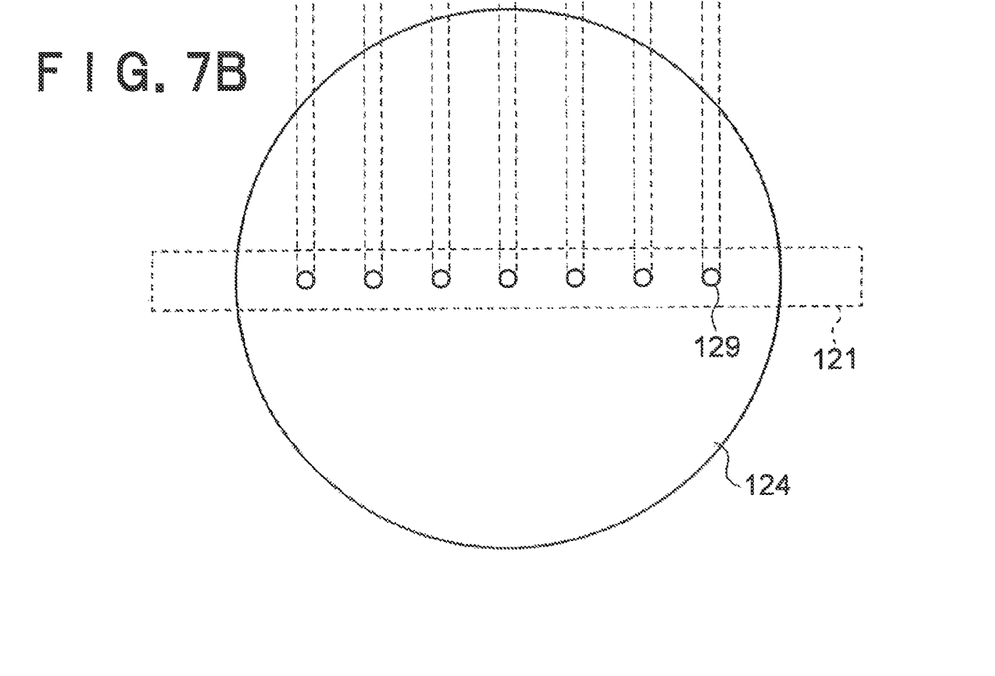

On the other hand, in a third embodiment, as shown in FIGS. 7A and 7B, the process gas G1 including an Sic source gas supplied from a gas supply unit is ejected from the gas ejection holes 129 via a gas pipe 410, coupling pipes 412A and 412B, and the gas flow path 121. According to the third embodiment, the gas pipe 410 is branched into two gas pipes 410A and 410B, and the gas pipes 410A and 410B are respectively connected to the gas flow path 121 by the coupling pipes 412A and 412B. FIG. 7A is a side view and FIG. 7B is a plan view.

The gas pipe 410A includes openable and closable coupling parts 414a to 414d, and the gas pipe 410B includes openable and closable coupling parts 414e to 414h. The gas flow path 121 includes coupling parts 416a to 416h that correspond to the respective coupling parts 414a to 414h. The coupling parts 414a to 414h and the coupling parts 416a to 416h can be connected to ends of the coupling pipes 412A and 412B.

One end of the coupling pipe 412A is coupled to one of the coupling parts 414a to 414d, and the other end thereof is coupled to the corresponding coupling part of the coupling parts 416a to 416d. One end of the coupling pipe 412B is connected to one of the coupling parts 414e to 414h and the other end thereof is connected to the corresponding coupling part of the coupling parts 416e to 416h. The coupling parts 414a to 414h and 416a to 416h having the coupling pipes 412A and 412B not coupled thereto are closed.

The farther the coupling pipes 412A and 412B from the coupling parts 416a to 416h having these pipes coupled thereto, the more the gas flow rate from the gas ejection holes 129 is reduced.

For example, as shown in FIGS. 7A and 7B, when the coupling pipe 412A couples the coupling part 414a to the coupling part 416a and the coupling pipe 412B couples the coupling part 414h to the coupling part 416h, among the gas ejection holes 129 provided in the gas flow path 121, the gas flow rate from the gas ejection holes 129 at the central part of the gas flow path 121 is lower than that from the gas ejection holes 129 at an end part thereof.

According to the third embodiment, the coupling parts 414a to 414h and 416a to 416h to which the coupling pipes 412A and 412B are coupled can be switched as appropriate. With this configuration, the gas flow rate of the gas ejection holes 129 can be adjusted, thereby improving the uniformity of gas flow rate.

(Fourth Embodiment)

Figure 8:
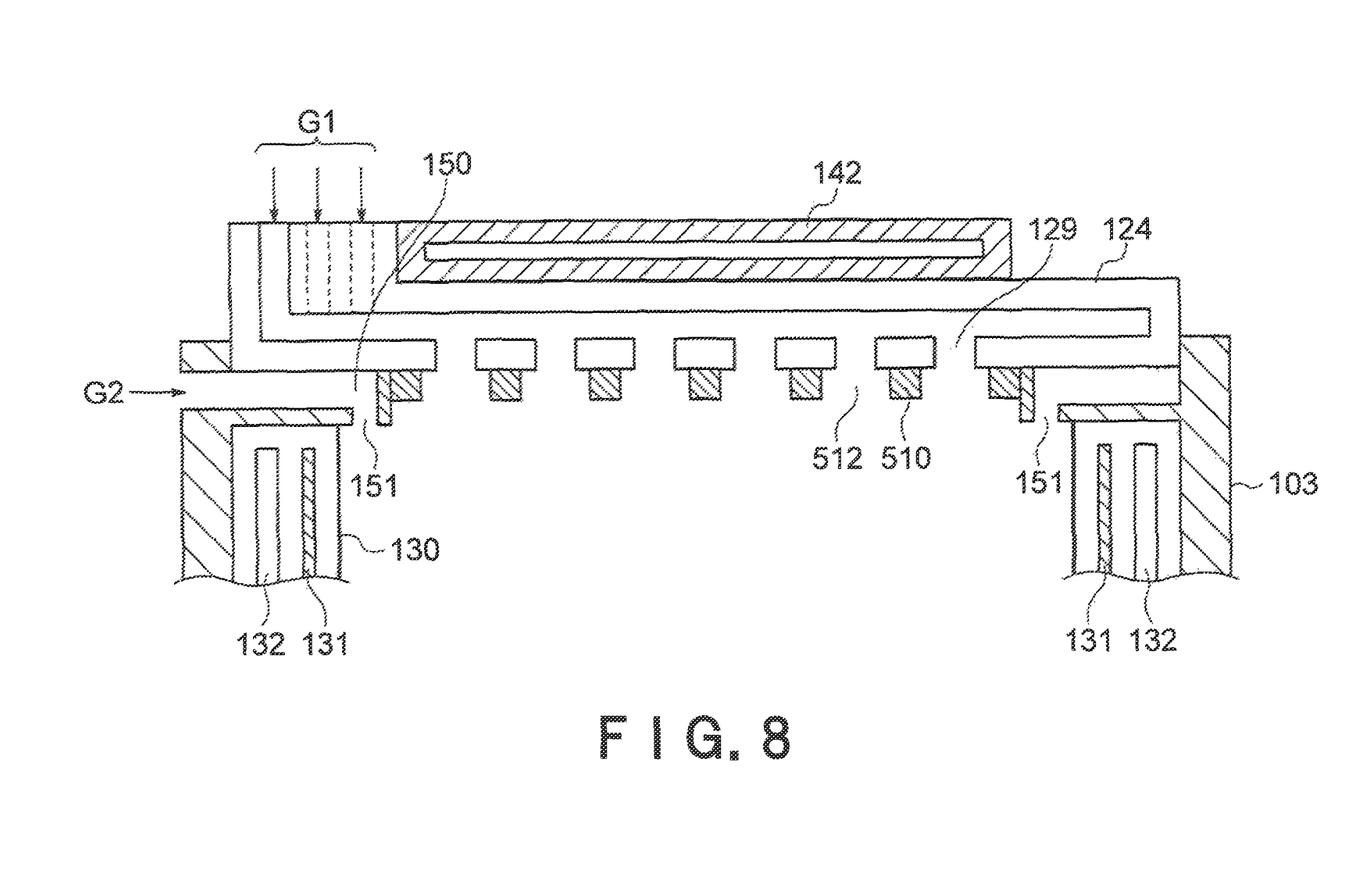
FIG. 8 shows a schematic configuration of relevant parts of a film formation apparatus according to a fourth embodiment.

FIG. 8 shows a schematic configuration of relevant parts of a film formation apparatus according to a fourth embodiment. The fourth embodiment is different from the first embodiment shown in FIG. 1 in that a reflector 510 is provided below the shower plate 124. In FIG. 8, elements identical to those of the first embodiment shown in FIG. 1 are denoted by like reference numerals and explanations thereof will be omitted.

The reflector 510 is formed of a high thermal resistance material such as quartz or carbon having SiC coated thereon. Holes 512 aligned with the gas ejection holes 129 of the shower plate 124 are formed in the reflector 510, and the diameter of each of the holes 512 is slightly larger than that of the gas ejection hole 129. The reflector 510 can be installed to contact a first surface of the shower plate 124 (a surface of the shower plate 124 opposing the substrate 101) or can be installed below the shower plate 124 with a distance of approximately 2 mm therebetween.

The process gas G1 including an SiC source gas ejected from the gas ejection holes 129 is supplied via the holes 512 of the reflector 510 to the surface of the substrate 101.

By providing the reflector 510, it is possible to prevent heat in the chamber 103 from being transmitted externally via the shower plate 124. With this configuration, heater power at the time of heating can be suppressed and the time required for increasing the temperature within the chamber 103 can be reduced.

Because a silane-based gas is supplied as the process gas G1 including an SiC source gas, it is preferable to use the reflector 510 formed of quartz. Silane may be deposited on the reflector 510 as a silane gas is supplied; however, in a case of using the reflector 510 formed of quartz, silane deposits can be removed by chemical washing. Therefore, the reflector 510 can be reused, so that the cost can be reduced.

(Fifth Embodiment)

Figure 9:
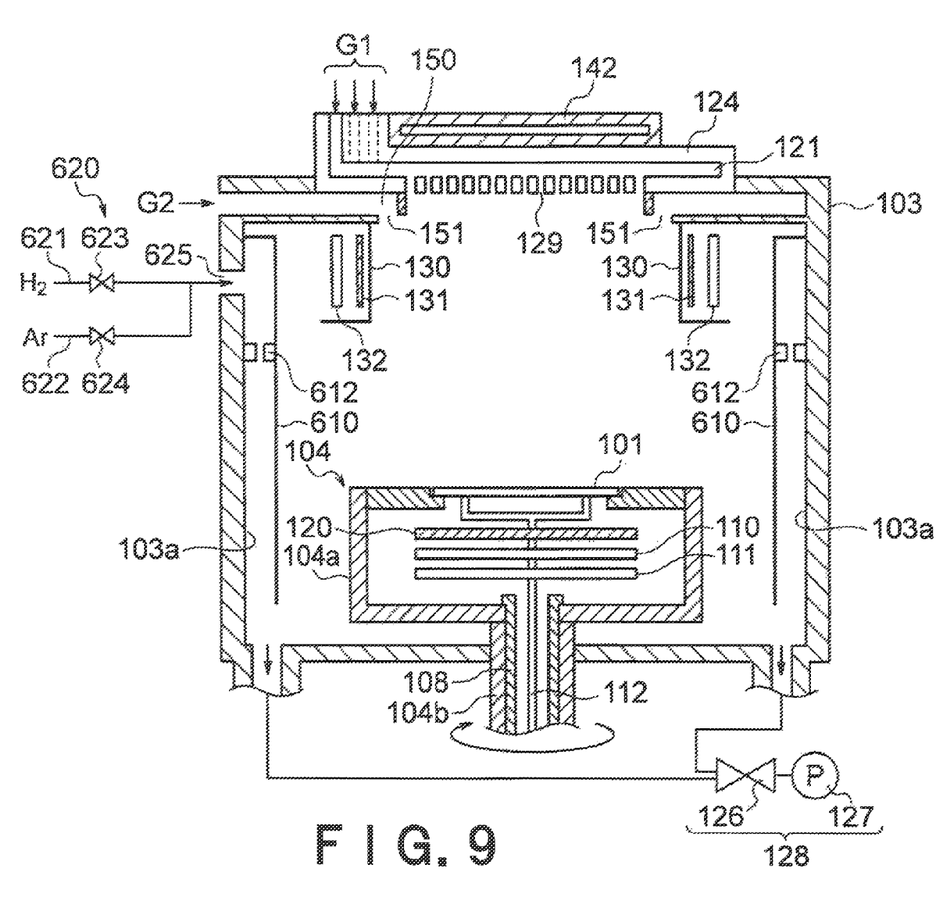
FIG. 9 shows a schematic configuration of a film formation apparatus according to a fifth embodiment.

FIG. 9 shows a schematic configuration of a film formation apparatus according to a fifth embodiment. The fifth embodiment is different from the first embodiment shown in FIG. 1 in that a cylindrical liner 610 is provided along the sidewall 103a of the chamber 103 and a gas supply unit (gas switching unit) 620 that supplies a hydrogen gas and an argon gas in a switching manner is also provided between the liner 610 and the sidewall 103a. In FIG. 9, elements identical to those of the first embodiment shown in FIG. 1 are denoted by like reference numerals and explanations thereof will be omitted.

The liner 610 partitions the sidewall 103a of the chamber 103 from a film formation area, and is formed of a high thermal resistance material such as carbon or carbon having SiC coated thereon. The liner 610 is positioned closer to a side of the sidewall 103a than the liner 130, the auxiliary heater 131, and the heat insulating material 132.

The liner 610 extends vertically in the chamber 103, and an upper end thereof is connected to the sidewall 103a. Therefore, the top of the space between the liner 610 and the sidewall 103a is configured to be closed.

Furthermore, a lower end of the liner 610 is at a position higher than the bottom surface of the chamber 103, and there is a predetermined distance between the liner 610 and the bottom surface of the chamber 103. Having the bottom surface of the chamber 103 as a reference, the height of the lower end of the liner 610 is preferably lower than that of the heater 120, and is more preferably lower than that of the reflector 110. Further, when the heat insulating material 111 is provided below the reflector 110, it is more preferable to set the height of the lower end of the liner 610 to be lower than that of the heat insulating material 111.

A rectifying plate 612 that rectifies a gas supplied from the gas supply unit 620 is provided between the liner 610 and the sidewall 103a. For example, the rectifying plate 612 is formed of a ring-shaped quartz plate having a plurality of holes of a diameter of approximately 1 mm formed thereon.

The gas supply unit 620 supplies a hydrogen gas and an argon gas between the liner 610 and the sidewall 103a in a switching manner. For example, the gas supply unit 620 can be constituted by a gas pipe 621 in which a hydrogen gas flows, a gas pipe 622 in which an argon gas flows, valves 623 and 624 for adjusting gas flows provided in the respective pipes 621 and 622, a control unit (not shown) that controls the opening degree of the valves, an introduction port 625 for introducing a hydrogen gas and an argon gas into the chamber 103, and the like. It is preferable that the introduction port 625 is arranged at a height position near the upper end of the liner 610 within the range between the upper end of the liner 610 and the rectifying plate 612.

A gas supplied from the gas supply unit 620 to the chamber 103 is rectified by the rectifying plate 612, flows downward in the space between the liner 610 and the sidewall 103a, and is exhausted from the gas exhaust part 125.

The thermal conductivity of an argon gas is low and the thermal conductivity of a hydrogen gas and a helium gas is high. Therefore, in order to increase the temperature within the chamber 103, the gas supply unit 620 supplies an argon gas. As an argon gas having low thermal conductivity flows in the space between the liner 610 and the sidewall 103a, it is possible to prevent heat in the chamber 103 from being transmitted externally. With this configuration, heater power at the time of heating can be suppressed and the time required for increasing the temperature within the chamber 103 can be reduced.

Furthermore, when the inside of the chamber 103 is cooled (when the temperature within the chamber 103 is reduced), the gas supply unit 620 supplies a hydrogen gas or a helium gas. Because a hydrogen gas having high thermal conductivity flows in the space between the liner 610 and the sidewall 103a, heat in the chamber 103 can be easily transmitted externally, and thus cooling rate can be increased. With this configuration, the time required for cooling the inside of the chamber 103 can be reduced.

As explained above, as a shielding gas flowing in the sidewall 103a is switched to an argon gas having low thermal conductivity or a hydrogen gas or a helium gas having high thermal conductivity in accordance with heating or cooling of the chamber 103, the time required for increasing or reducing the temperature within the chamber 103 can be reduced.

Furthermore, as the liner 610 is provided and the height of a lower end of the liner 610 is set lower than that of the heater 120, it is possible to prevent a gas supplied from the gas supply unit 620 from flowing into the periphery of the substrate 101. For example, as pre-processing for cooling, it is possible to configure that a hydrogen gas is started to be supplied from the gas supply unit 620 during film formation.

An argon gas having low thermal conductivity and a hydrogen gas and a helium gas having high thermal conductivity that are used as a shielding gas can be used alone, or these gases can include other gases as long as the thermal conductivity and the reactivity with a process gas are not greatly affected.

In the fifth embodiment, it is preferable that, in the gas supply unit 620, the total flow of an argon gas and a hydrogen gas is kept constant. With this configuration, pressure variation in the chamber 103 can be suppressed, and it becomes possible to prevent particles from being generated on the substrate 101.

In the fifth embodiment, it is preferable to provide a plurality of introduction ports 625 for introducing a gas from the gas supply unit 620 into the chamber 103. By providing a plurality of introduction ports 625, a gas can flow more uniformly in the space between the liner 610 and the sidewall 103a.

Furthermore, in the fifth embodiment, instead of the shower plate 124, a single or plural process gas supply ports can be provided. In addition, the rectifying plate 612 is not always required to be provided, and effects of the fifth embodiment can be obtained with or without the rectifying plate 612.

The present invention is not limited to the above embodiments as they are, and in implementing stages of the invention, the invention can be embodied while modifications are made to constituent elements without departing from the spirit of the invention. Furthermore, various other inventions can be formed by appropriate combinations of a plurality of constituent elements disclosed in the above embodiments. For example, several constituent elements can be omitted from the all constituent elements described in the above embodiments. Further, constituent elements in different embodiments can be combined as appropriate.

The invention claimed is:

1. A film formation apparatus comprising:
   a film formation chamber performing film formation on a substrate;
   a first cylindrical liner provided inside of a sidewall of the film formation chamber;
   a second cylindrical liner provided inside of the sidewall of the film formation chamber, and between the first cylindrical liner and the sidewall of the film formation chamber, an upper end of the second cylindrical liner being connected to the sidewall of the film formation chamber;
   a process-gas supply unit provided at a top of the film formation chamber and having a first gas ejection hole supplying a process gas to inside of the first cylindrical liner;
   a first heater provided outside of the first cylindrical liner in the film formation chamber and heating the substrate from above;
   a second heater heating the substrate from below;
   a first shielding gas supply unit having a plurality of second gas ejection holes supplying a first shielding gas to an inside of the first cylindrical liner and supplying the first shielding gas to a position closer to the sidewall of the film formation chamber than a position of the first gas ejection hole; and
   a second shielding gas supply unit having a plurality of third gas ejection holes supplying a second shielding gas to a position between the sidewall of the film formation chamber and the second cylindrical liner.

2. The apparatus of claim 1, wherein the first shielding gas consists of at least one of a hydrogen gas, an argon gas, and a helium gas.

3. The apparatus of claim 1, further comprising a gas switching unit, wherein the gas switching unit supplies an argon gas when a temperature within the film formation chamber Is increased, and supplies at least one of a hydrogen gas and a helium gas when inside of the film formation chamber is cooled.

4. The apparatus of claim 1, further comprising a gas switching unit,
   wherein the gas switching unit supplies an argon gas when a temperature within the film formation chamber Is increased, and supplies at least one of a hydrogen gas and a helium gas when inside of the film formation chamber is cooled; and
   the first shielding gas consists of at least one of a hydrogen gas, an argon gas, and a helium as.

5. The apparatus of claim 1, wherein the process-gas supply unit comprises a shower plate arranged horizontally and having a plurality of gas flow paths connected to a plurality of the first gas ejection holes.

6. The apparatus of claim 1, wherein the process-gas supply unit supplies a gas including an SIC source gas or an etching gas.

7. The apparatus of claim 1, wherein a horizontal position of the second gas ejection hole is between the first gas ejection hole and the liner.

8. The apparatus of claim 1, wherein a horizontal position of the second gas ejection hole is closer to a sidewall of the film formation chamber than a position of the first gas ejection hole.

9. The apparatus of claim 5, wherein
   the gas flow path comprises a plurality of first coupling parts supplying the process gas to the process-gas supply unit, and
   the film formation apparatus further comprising:
      a gas pipe having a plurality of second coupling parts for supplying the process gas to the gas flow path; and
      a coupling pipe connecting a part of the first coupling parts to a part of the second coupling parts.

10. The apparatus of claim 9 wherein the second gas ejection hole supplies the shielding gas vertically downward.

11. The apparatus of claim 1, further comprising a closing member closing at least a part of the first gas ejection holes.

12. The apparatus of claim 1, further comprising a reflector provided below the process-gas supply unit and suppressing heat in the film formation chamber to be transmitted externally.

* * * * *